United States Patent
Donachy et al.

(10) Patent No.: US 11,102,910 B2
(45) Date of Patent: Aug. 24, 2021

(54) FLEXIBLE SERVICE AIR BAFFLE

(71) Applicant: Dell Products L.P., Round Rock, TX (US)

(72) Inventors: John Charles Donachy, Austin, TX (US); Amrita Sidhu Maguire, Cedar Park, TX (US); Patrick Vincent Illingworth, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 583 days.

(21) Appl. No.: 15/666,297

(22) Filed: Aug. 1, 2017

(65) Prior Publication Data
US 2019/0045659 A1  Feb. 7, 2019

(51) Int. Cl.
*H05K 7/20* (2006.01)
*G06F 1/20* (2006.01)

(52) U.S. Cl.
CPC ........... *H05K 7/20145* (2013.01); *G06F 1/20* (2013.01); *H05K 7/20727* (2013.01); *H05K 2203/176* (2013.01)

(58) Field of Classification Search
USPC ................................. 361/679.48, 679.5, 678
See application file for complete search history.

(56) References Cited

U.S. PATENT DOCUMENTS

| | | | | |
|---|---|---|---|---|
| 4,158,875 A * | 6/1979 | Tajima | ............... | H05K 7/20154 174/16.1 |
| 4,399,485 A * | 8/1983 | Wright | ............... | H05K 7/20009 165/80.3 |
| 4,653,574 A * | 3/1987 | Quinlisk | ............... | F24F 12/001 165/54 |
| 4,672,509 A * | 6/1987 | Speraw | ............. | H05K 7/20572 165/122 |
| 4,729,227 A * | 3/1988 | Peden | ..................... | F24F 13/32 454/330 |
| 5,170,550 A * | 12/1992 | Cox | ........................ | F24F 13/20 220/62.11 |
| 5,914,858 A * | 6/1999 | McKeen | ............ | H05K 7/20563 165/80.3 |
| 6,220,503 B1 * | 4/2001 | Cox | ....................... | B23K 1/018 228/175 |

(Continued)

OTHER PUBLICATIONS

NETAPP Inc., Replacing a Controller Canister in the E5660 Controller-Drive Tray to Replace a Failed Host Interface Card, Dec. 2014.

*Primary Examiner* — Avinash A Savani
*Assistant Examiner* — Frances F. Hamilton
(74) *Attorney, Agent, or Firm* — Jackson Walker L.L.P.

(57) ABSTRACT

A baffle is provided that is usable in an information handling system. The information handling system may have a first compartment at a first elevated pressure that is higher than an ambient pressure and a second compartment at a second elevated pressure that is higher than the ambient pressure. Further, a region adjacent to the first and second compartments and in fluid communication therewith may be operable to receive a removable baffle therein. When the baffle is inserted into the region, it may be operable to maintain the region at a third elevated pressure that is higher than the ambient pressure. However, when not inserted into the region, the baffle may be foldable into a substantially flat shape.

20 Claims, 5 Drawing Sheets

(56) References Cited

U.S. PATENT DOCUMENTS

| | | | |
|---|---|---|---|
| 6,311,735 B1 * | 11/2001 | Small, Sr. | F16L 9/003 138/109 |
| 6,390,320 B2 * | 5/2002 | Hurst | H05K 9/0016 174/365 |
| 6,464,125 B2 * | 10/2002 | Cox | B23K 1/018 228/33 |
| 6,480,379 B1 * | 11/2002 | Dickey | G06F 1/184 361/679.51 |
| 6,594,148 B1 * | 7/2003 | Nguyen | H05K 7/20563 361/695 |
| 6,837,554 B2 * | 1/2005 | Yamamoto | H05K 9/0016 312/223.2 |
| 6,972,949 B1 * | 12/2005 | Helgenberg | G06F 1/183 361/679.02 |
| 7,009,839 B2 * | 3/2006 | Clinard | H05K 7/1492 174/98 |
| 7,092,252 B2 * | 8/2006 | Robertson | G06F 1/20 257/E23.099 |
| 7,256,992 B1 * | 8/2007 | Stewart | G06F 1/20 165/80.3 |
| 7,307,832 B1 * | 12/2007 | Lewis | H05K 7/20145 361/679.01 |
| 7,403,387 B2 * | 7/2008 | Pav | G06F 1/20 361/694 |
| 7,459,642 B2 * | 12/2008 | Culpepper | H05K 7/1429 174/521 |
| 7,595,986 B2 * | 9/2009 | Glover | G06F 1/20 361/694 |
| 7,817,417 B2 * | 10/2010 | Franz | H05K 7/20145 361/679.49 |
| 7,839,631 B2 * | 11/2010 | Lee | G06F 1/20 361/679.49 |
| 7,843,685 B2 * | 11/2010 | Beauchamp | G06F 1/20 361/679.49 |
| 7,864,541 B2 * | 1/2011 | Lucero | G06F 1/20 361/679.51 |
| 7,907,402 B2 * | 3/2011 | Caveney | H05K 7/20572 361/694 |
| 7,952,869 B2 * | 5/2011 | Lewis, II | H05K 7/20 361/695 |
| 8,009,417 B2 * | 8/2011 | Searby | G06F 1/20 165/104.33 |
| 8,102,651 B2 * | 1/2012 | Bland | G06F 1/20 361/694 |
| 8,355,246 B2 * | 1/2013 | Linhares, Jr. | H05K 7/20736 361/679.46 |
| 8,385,072 B2 * | 2/2013 | Chang | G06F 1/183 361/719 |
| 8,405,984 B2 * | 3/2013 | Donowho | H05K 7/20572 312/236 |
| 8,502,087 B2 * | 8/2013 | Medrano | H05K 9/0018 174/383 |
| 8,638,554 B2 * | 1/2014 | Wei | H05K 7/20727 165/80.3 |
| 8,714,667 B2 * | 5/2014 | Lakoduk | H05K 5/0221 312/263 |
| 8,730,671 B2 * | 5/2014 | VanDerVeen | H05K 7/20736 165/104.33 |
| 8,737,060 B2 * | 5/2014 | Sun | G06F 1/20 361/679.49 |
| 8,873,236 B1 * | 10/2014 | Tamarkin | H05K 7/20172 361/695 |
| 9,298,229 B2 * | 3/2016 | Schelshorn | H05K 7/20727 |
| 9,521,778 B2 * | 12/2016 | Lin | G06F 1/20 |
| 9,674,983 B2 * | 6/2017 | Huang | G06F 1/20 |
| 9,769,952 B2 * | 9/2017 | Wands | H05K 7/20745 |
| 9,836,102 B1 * | 12/2017 | Anderl | G06F 1/20 |
| 9,839,155 B2 * | 12/2017 | Fleming | H05K 7/20145 |
| 9,913,410 B2 * | 3/2018 | Ambriz | H05K 7/20836 |
| 9,955,612 B2 * | 4/2018 | Pofahl | G06F 1/20 |
| 10,061,364 B2 * | 8/2018 | Kobayashi | G06F 1/263 |
| 10,190,797 B2 * | 1/2019 | Gray | F24F 13/24 |
| 10,244,666 B2 * | 3/2019 | Tsai | G06F 1/20 |
| 10,299,409 B2 * | 5/2019 | Campbell | H05K 7/20172 |
| 10,321,601 B2 * | 6/2019 | Vaananen | H05K 7/20145 |
| 10,455,744 B2 * | 10/2019 | Grinberg | H05K 7/20572 |
| 2005/0071689 A1 * | 3/2005 | Coward | G06F 1/189 713/300 |
| 2005/0157472 A1 * | 7/2005 | Malone | H05K 7/20563 361/724 |
| 2006/0120192 A1 * | 6/2006 | Miyamoto | G11B 33/12 365/221 |
| 2006/0213498 A1 * | 9/2006 | Sellwood | F16L 9/003 126/80 |
| 2008/0068791 A1 * | 3/2008 | Ebermann | G06F 1/20 361/679.49 |
| 2008/0174948 A1 * | 7/2008 | Davis | G11B 33/127 361/679.31 |
| 2008/0316703 A1 * | 12/2008 | Donowho | H05K 7/20572 361/695 |
| 2009/0061755 A1 * | 3/2009 | Calder | H05K 7/20736 454/184 |
| 2009/0116190 A1 * | 5/2009 | Glover | G06F 1/20 361/695 |
| 2009/0244842 A1 * | 10/2009 | Iwakiri | H05K 7/20727 361/695 |
| 2011/0081851 A1 * | 4/2011 | Franz | H05K 7/20145 454/184 |
| 2011/0174402 A1 * | 7/2011 | Lai | H05K 7/20727 137/583 |
| 2011/0273835 A1 * | 11/2011 | Katakura | G06F 1/181 361/679.33 |
| 2012/0270492 A1 * | 10/2012 | VanDerVeen | H05K 7/20736 454/184 |
| 2013/0115869 A1 * | 5/2013 | Alshinnawi | H05K 7/20736 454/184 |
| 2013/0170135 A1 * | 7/2013 | Ma | H05K 7/20727 361/679.51 |
| 2014/0078668 A1 * | 3/2014 | Goulden | G06F 1/20 361/679.47 |
| 2014/0232511 A1 * | 8/2014 | Durth | H05K 1/0201 337/180 |
| 2014/0268569 A1 * | 9/2014 | Stuhlsatz | H05K 7/20563 361/695 |
| 2015/0124405 A1 * | 5/2015 | Lee | F04D 29/601 361/695 |
| 2015/0208554 A1 * | 7/2015 | Leigh | G06F 1/20 165/80.3 |
| 2016/0227669 A1 * | 8/2016 | Kwon | H05K 7/20727 |
| 2016/0262286 A1 * | 9/2016 | Lin | H05K 7/20145 |
| 2016/0374218 A1 * | 12/2016 | Lakoduk | H05K 5/0221 |
| 2018/0035562 A1 * | 2/2018 | Roesner | H05K 7/1487 |
| 2018/0084669 A1 * | 3/2018 | Tsai | H05K 7/20727 |
| 2019/0116688 A1 * | 4/2019 | Chu | G06F 1/20 |

* cited by examiner

FLEXIBLE SERVICE AIR BAFFLE

TECHNICAL FIELD

The present disclosure relates in general to information handling systems, and more particularly to an air baffle for use in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans, blowers, etc.) have often been used in information handling systems to cool information handling systems and their components. In addition, baffles are also often used to direct air flow from air movers to concentrate air flow to those components requiring air cooling. In some cases, a temporary baffle may be used to direct airflow in an enclosure while an information handling system (or a component thereof) is removed for service or maintenance.

Traditional baffles (also sometimes referred to as removable blanks, inserts, or blanking panels) are typically made of hard-tooled steel or injection-molded plastic. This tends to create fixed, rigid geometries. Other traditional solutions may include integrated components within a physical enclosure system that are hinged "doors" or panels that move into place further within the hardware enclosure. Removable baffles may provide various advantages compared to such integrated components, however.

SUMMARY

In accordance with the teachings of the present disclosure, the disadvantages and problems associated with heat transfer from information handling resources of an information handling system may be substantially reduced or eliminated.

In accordance with embodiments of the present disclosure, the disadvantages and problems associated with existing approaches to the use of baffles may be reduced or eliminated.

In accordance with embodiments of the present disclosure, an information handling system may include a first compartment at a first elevated pressure that is higher than an ambient pressure, a second compartment at a second elevated pressure that is higher than the ambient pressure, and a region adjacent to the first and second compartments and in fluid communication therewith. The region may be operable to receive a removable baffle therein. When the baffle is inserted into the region, it may be operable to maintain the region at a third elevated pressure that is higher than the ambient pressure. When the baffle is not inserted into the region, it may be foldable into a substantially flat shape.

In accordance with these and other embodiments of the present disclosure, a baffle may include a plurality of airflow-directing surfaces. The baffle may, when inserted into a region of an information handling system that is adjacent to first and second compartments of the information handling system and in fluid communication therewith, be operable to maintain the first and second compartments at at least one elevated pressure that is higher than an ambient pressure. The baffle may, when not inserted into the region of the information handling system, be foldable into a substantially flat shape.

In accordance with these and other embodiments of the present disclosure, a method for forming a baffle for directing an airflow in an information handling system may include forming a baffle having a plurality of airflow-directing surfaces from a baffle material. The method may further include shaping and sizing the baffle such that when inserted into a region of an information handling system that is adjacent to first and second compartments of the information handling system and in fluid communication therewith, the baffle is operable to maintain the first and second compartments at at least one elevated pressure that is higher than an ambient pressure, and when not inserted into the region of the information handling system, the baffle is foldable into a substantially flat shape.

Technical advantages of the present disclosure may be readily apparent to one skilled in the art from the figures, description and claims included herein. The objects and advantages of the embodiments will be realized and achieved at least by the elements, features, and combinations particularly pointed out in the claims. Various embodiments may achieve all, some, or even none of the mentioned advantages.

It is to be understood that both the foregoing general description and the following detailed description are examples and explanatory in nature, and they are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 8, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system. In some instances, an information handling resource may be a full information handling system in its own right, which is a component of a larger information handling system (e.g., a blade component of a blade server).

Figure 1:
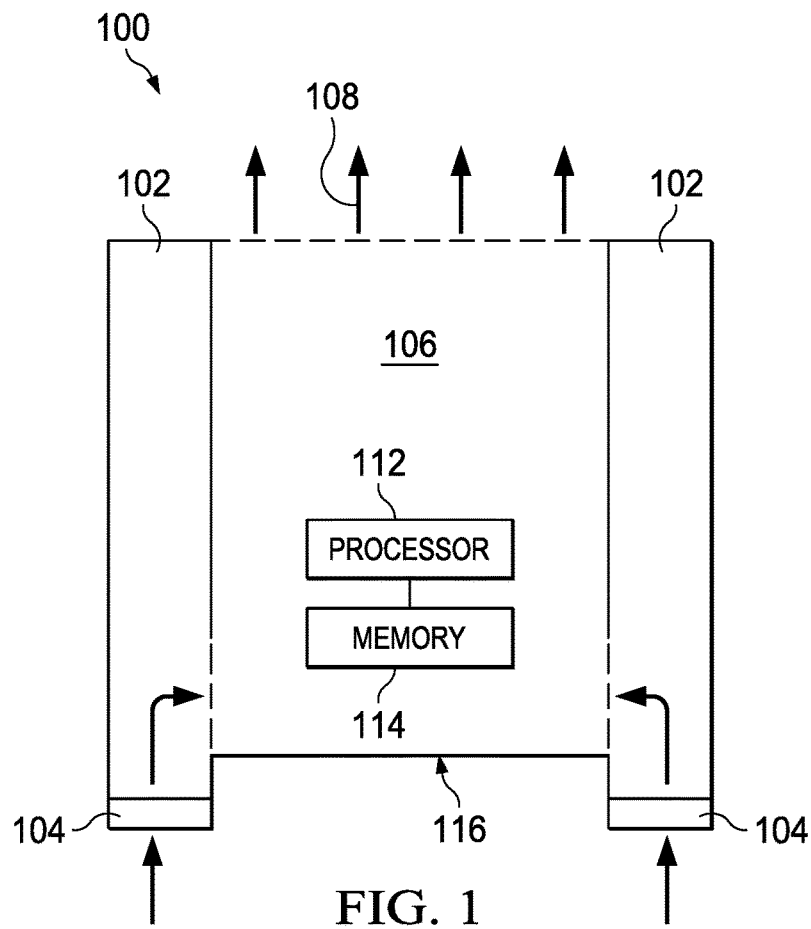
FIG. 1 illustrates a block diagram of an example information handling system, in accordance with embodiments of the present disclosure.

FIG. 1 illustrates a block diagram of an example information handling system 100, in accordance with embodiments of the present disclosure. In some embodiments, information handling system 100 may comprise a server. In other embodiments, information handling system 100 may be a personal computer (e.g., a desktop computer, a laptop, notebook, tablet, handheld, smart phone, personal digital assistant, etc.). As depicted in FIG. 1, information handling system 100 may include a chassis housing a plurality of information handling resources including, without limitation, information handling resource 106, compartments 102, and air movers 104. Information handling resource 106 may further include processor 112 and memory 114 communicatively coupled to processor 112. In some embodiments, information handling resource 106 may be a full information handling system in its own right. In some embodiments, information handling system 100 may include a plurality of information handling resources 106 (not shown separately).

The chassis of information handling system 100 may serve as a container for various information handling systems and/or information handling resources, and it may be constructed from steel, aluminum, plastic, and/or any other suitable material. Although the term "chassis" is used, the chassis of information handling system 100 may also be referred to as a case, cabinet, tower, box, enclosure, and/or housing. In certain embodiments, the chassis may be configured to hold and/or provide power to a plurality of information handling systems and/or information handling resources.

Processor 112 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 112 may interpret and/or execute program instructions and/or process data stored in memory 114 and/or another component of information handling system 100.

Memory 114 may be communicatively coupled to processor 112 and may include any system, device, or apparatus configured to retain program instructions and/or data for a period of time (e.g., computer-readable media). Memory 114 may include RAM, EEPROM, a PCMCIA card, flash memory, magnetic storage, opto-magnetic storage, or any suitable selection and/or array of volatile or non-volatile memory that may or may not retain data after power to information handling system 100 is turned off.

Air movers 104 may include any mechanical or electro-mechanical system, apparatus, or device operable to move air and/or other gases. In some embodiments, an air mover 104 may comprise a fan (e.g., a rotating arrangement of vanes or blades which act on the air). In other embodiments, an air mover 104 may comprise a blower (e.g., a centrifugal fan that employs rotating impellers to accelerate air received at its intake and change the direction of the airflow). In these and other embodiments, rotating and other moving components of air mover 104 may be driven by a motor. The rotational speed of such motor may be controlled by suitable control signals communicated from processor 112 or a controller of air mover 104, which may or may not be in communication with processor 112. In operation, air mover 104 may cool information handling resources of information handling system 100 by drawing cool air into the chassis, moving cool air across components of information handling resource 106 (e.g., processor 112 or any other heat rejecting media), and expelling warm air from the chassis at exhaust 108.

As shown, compartments 102 may be proximate to air movers 104 such that air movers 104 may increase the pressure inside compartments 102 to a level somewhat above the ambient pressure outside the chassis of information handling system 100. In some cases, the elevated pressures inside compartments 102 may be equal to one another. In other cases, they may be slightly different (e.g., because the rotational speed of air movers 104 may not be identical, or some other minor difference may be present). As further shown, air may flow from compartments 102 into information handling resource 106 before exiting the chassis at exhaust 108. Information handling resource 106 may further include wall 116, discussed in more detail below. Compartments 102 may further include various circuitry, information handling resources, etc.

The term "heat-rejecting media" may include any system, device, or apparatus configured to transfer heat from an information handling system or information handling resource, thus reducing a temperature thereof. For example, heat-rejecting media may include a fluid conveyed proximate to an information handling resource (e.g., air conveyed by a fan or blower, liquid conveyed via a liquid conduit by a pump, etc.), or a solid thermally coupled to the information handling resource (e.g., heatpipe, heat spreader, heatsink, finstack, etc.).

In addition to information handling resource 106, processor 112, memory 114, and air movers 104, information handling system 100 may include one or more other information handling resources.

Figure 2A:
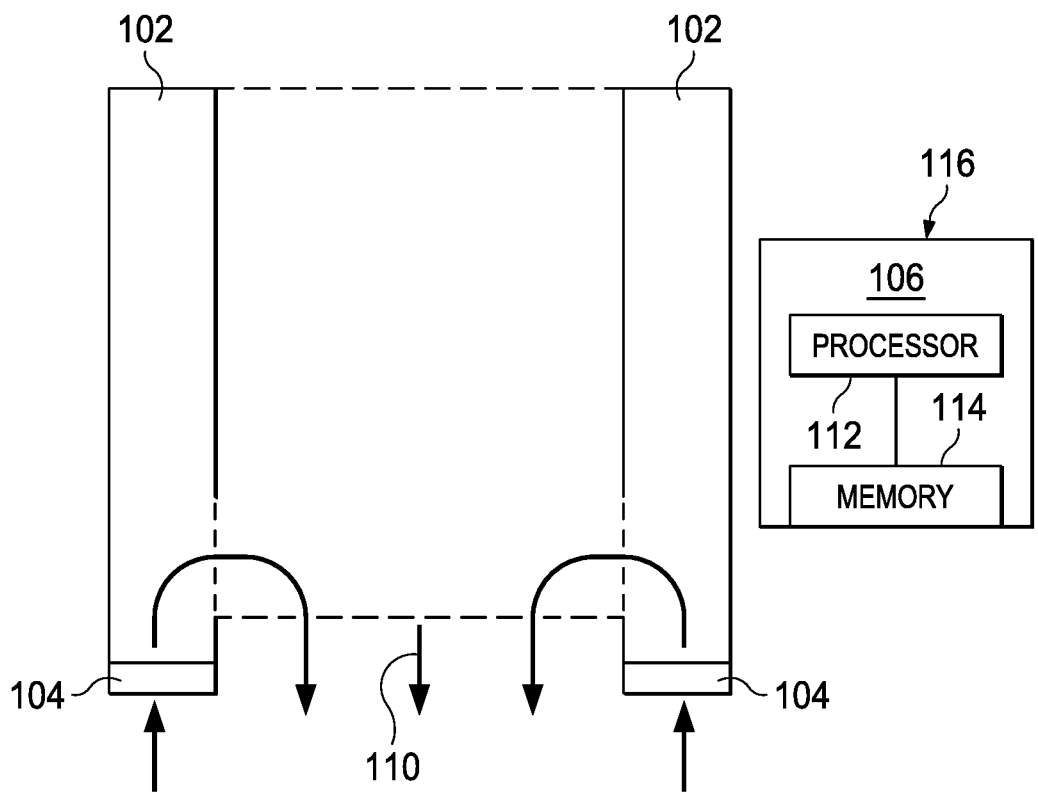
FIG. 2A illustrates a block diagram of the example information handling system of FIG. 1, with an information handling resource removed, in accordance with embodiments of the present disclosure.

Turning now to FIG. 2A, another block diagram of information handling system 100 is shown, in which information handling resource 106 has been removed. This may occur, for example, to conduct maintenance or repair on information handling resource 106 or some component thereof. Information handling system 100 may remain powered on during such maintenance, for example because it may be desired for other information handling resources 106 (not shown) to continue operation uninterrupted.

FIG. 2A illustrates a potential problem that may arise when information handling resource 106 is removed and information handling system 100 remains in operation. With information handling resource 106 removed, there is nothing to prevent cooling air from escaping information handling system 100 via leakage path 110. (In FIG. 1, wall 116 of information handling resource 106 was operable to prevent such escape.) This loss of pressure and cooling airflow may be undesirable, for example because it may reduce the airflow through other information handling resources 106 of information handling system 100 (not shown).

Figure 2B:
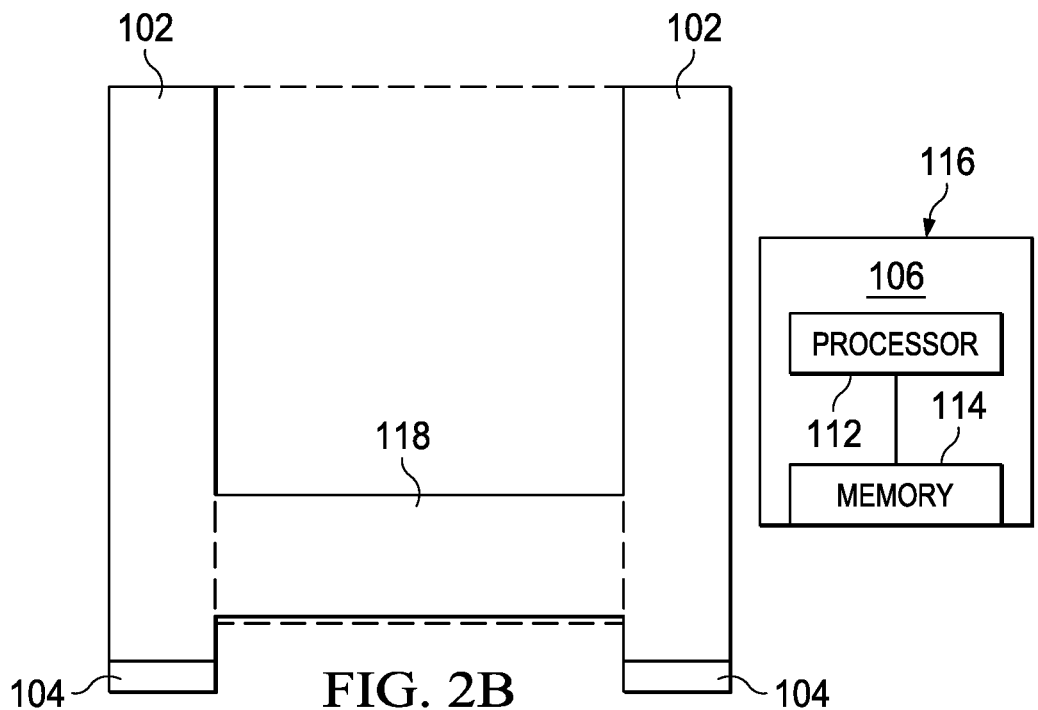
FIG. 2B illustrates a block diagram of the example information handling system of FIG. 2A, with a baffle added, in accordance with embodiments of the present disclosure.

Turning now to FIG. 2B, a solution to the problem of FIG. 2A is shown. In FIG. 2B, baffle 118 has been placed in the region of information handling system 100 between compartments 102. Baffle 118 is disposed between compartments 102 such that the interior of baffle 118 is in fluid communication with compartments 102, and air may flow between compartments 102, but it may be difficult for air to escape compartments 102. For example, it may be difficult for air to flow into most of the area formerly occupied by information handling resource 106. Baffle 118 is disposed such that it blocks leakage path 110, essentially taking the place of wall 116 of information handling resource 106. Accordingly, baffle 118 may maintain the pressure of compartments 102 at a level somewhat higher than ambient pressure, allowing airflow to cool other information handling resources 106 (not shown) that may remain installed and operational in information handling system 100 during the maintenance of removed information handling resource 106.

Figure 3:
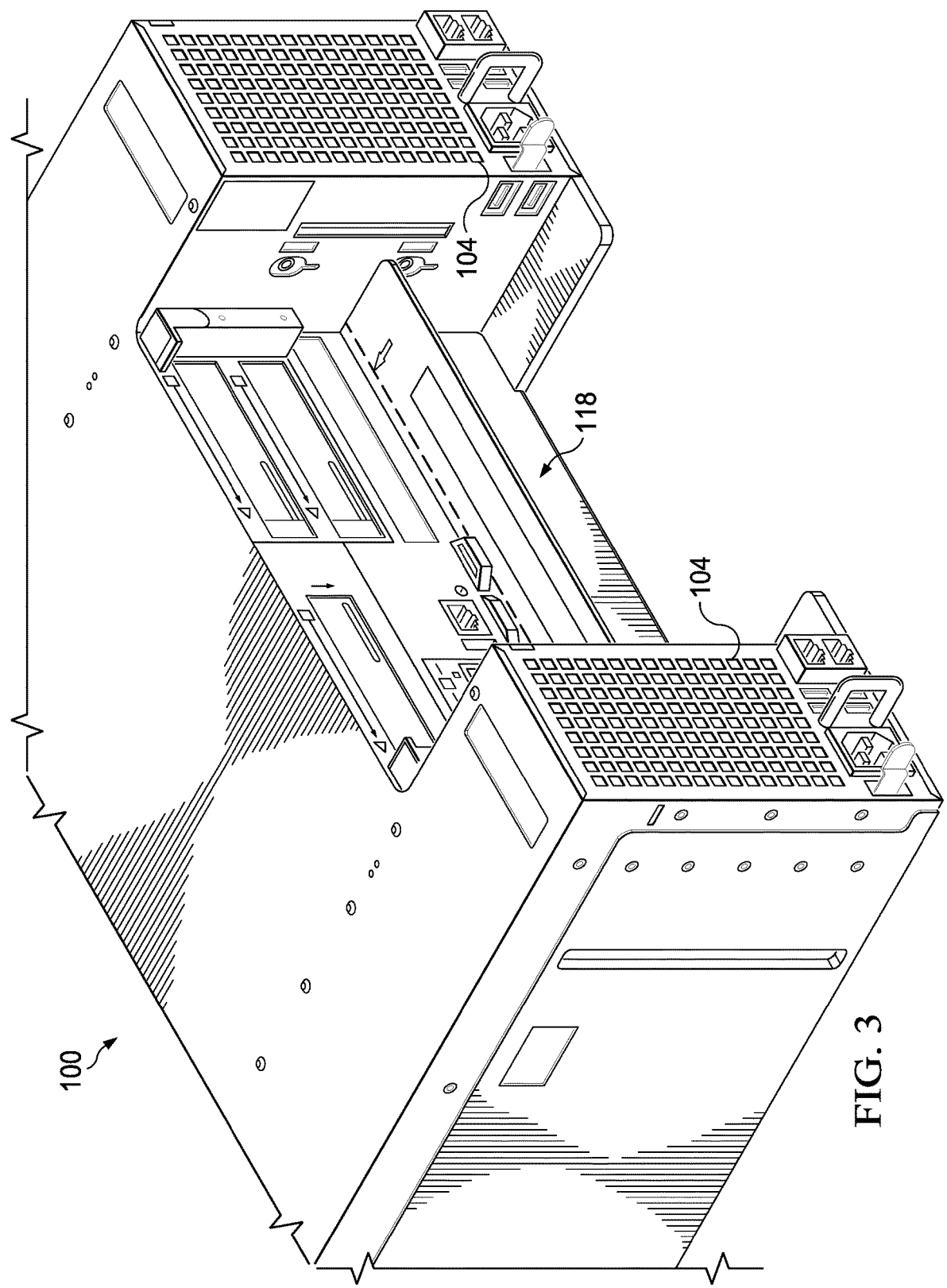
FIG. 3 illustrates a perspective view of the information handling system of FIG. 2B, in accordance with embodiments of the present disclosure.

Turning now to FIG. 3, a perspective view of the embodiment of FIG. 2B is shown. As in FIG. 2B, information handling resource 106 has been removed from information handling system 100, and baffle 118 has been added in its place. This prevents the escape of air pressure and airflow provided by air movers 104, forcing such airflow to cool other information handling resources of information handling system 100 as designed.

Figure 4:
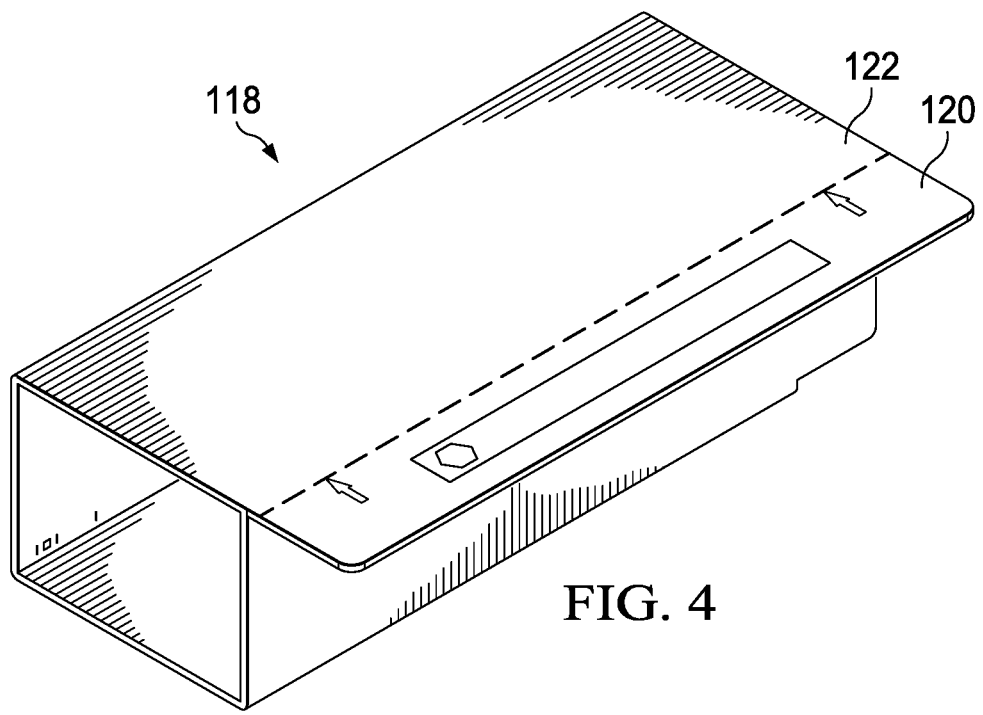

Turning now to FIG. 4, a perspective view of baffle 118 is shown. Baffle 118 is formed generally in the shape of a rectangular prism that is open on two opposite ends. Thus when inserted into information handling system 100, this shape allows air to flow between the two compartments 102. Handle 120 is formed on one side of baffle 118 to allow a user to easily insert and remove baffle 118 from information handling system 100.

In some embodiments, baffle 118 may be formed from a single flat sheet of baffle material. That is, baffle 118 may be formed by folding a sheet of baffle material into the shape of a rectangular prism with a handle 120 extending therefrom in this embodiment. Once formed into an appropriate shape, the adjacent portions of baffle 118 may be affixed to one another along seam 122 in any suitable manner (e.g., the two adjacent layers at seam 122 may be joined together with glue or any other type of fastener). Baffle 118 may be made of any suitable material; in some embodiments, baffle 118 may be made of a plastic material. In some embodiments, baffle 118 may be made of any selected industry-approved, semi-rigid materials, such as plastics or polymers, coated materials that meet fire and ESD requirements for air-restriction applications, or any other suitable material.

Advantageously, baffle 118 may be sized and shaped such that it is readily insertable into and/or removable from its location within information handling system 100 without the need of tools, fasteners, or mounting features. In this embodiment, the edges of baffle 118 disposed at the open ends of the rectangular prism are used as locating features to maintain baffle 118 in its desired position and orientation in information handling system 100.

Figure 5:
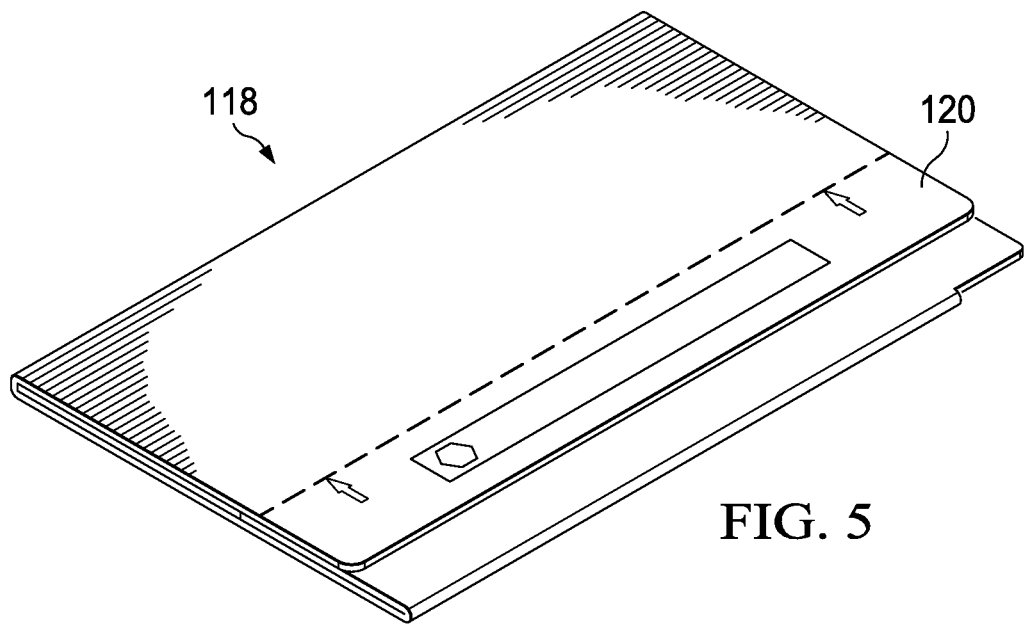

Turning now to FIG. 5, an embodiment of baffle 118 is shown that has been folded into a substantially flat shape. As can be seen, the top layer of baffle 118 has been folded forward and downward until it lies adjacent to the bottom layer of baffle 118. The ability to fold baffle 118 into a substantially flat shape may confer various advantages. For example, the foldable design of baffle 118 may reduce the amount of material cost and waste, as well as reducing shipping costs since it can be shipped flat.

For purposes of this disclosure, the term "substantially flat" refers to a shape that is generally planar. For example, as shown folded in FIG. 5, although portions of baffle 118 may have two layers of baffle material stacked on top of one another (or even three layers at seam 122), these layers are all parallel and lying adjacent to one another. Thus the resulting shape is considered substantially flat. In contrast, baffle 118 as shown in FIG. 4 would not be considered substantially flat, because it encloses a substantial three-dimensional volume, it contains members that lie in non-parallel planes, and the parallel members it does have are non-adjacent to one another.

Figure 6:
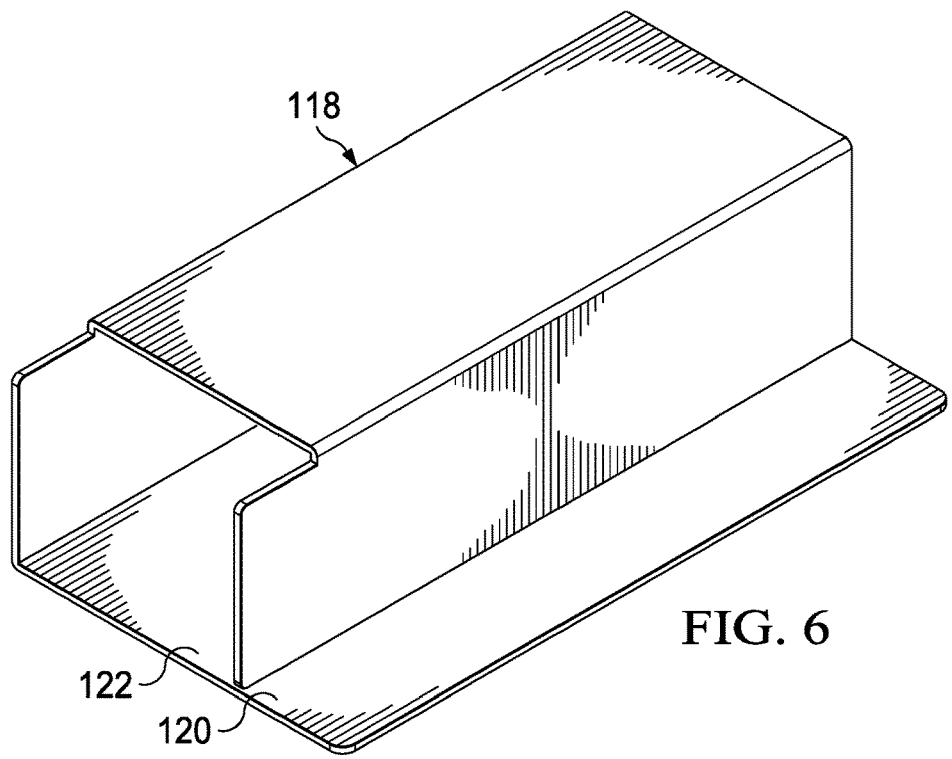
FIGS. 4-6 illustrate perspective views of a baffle, in accordance with embodiments of the present disclosure.

Turning now to FIG. 6, a bottom view of baffle 118 is shown. As can be seen, this is a view of the embodiment of FIG. 4, in which baffle 118 has not been folded substantially flat.

Figure 7:
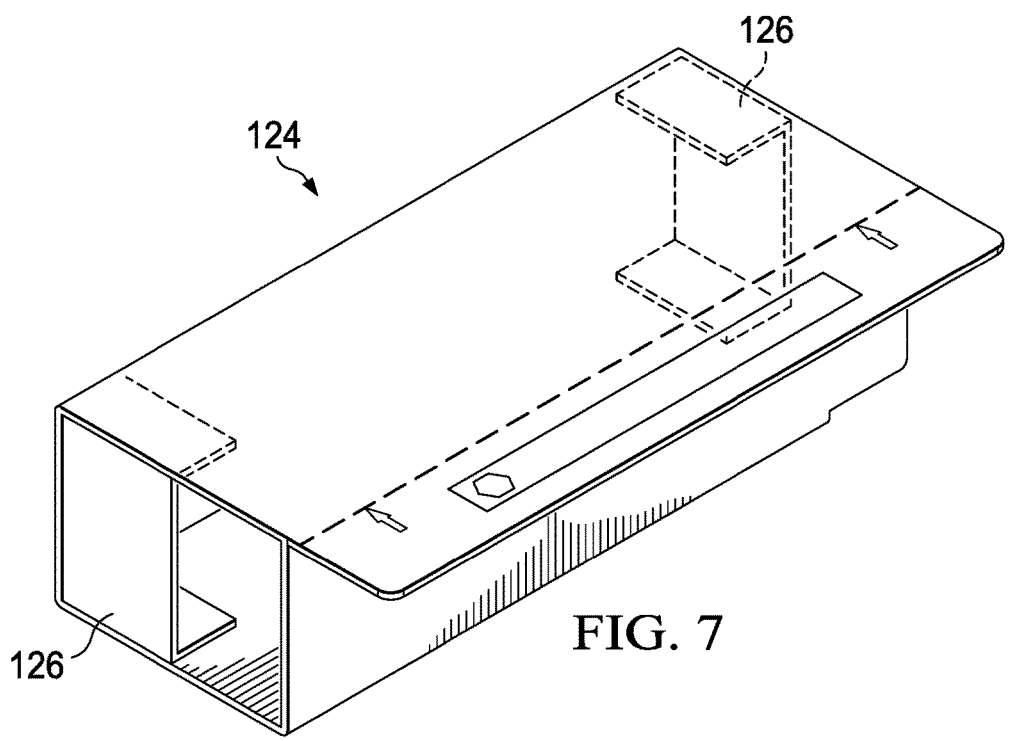
FIGS. 7-8 illustrate perspective views of another baffle, in accordance with embodiments of the present disclosure.
Figure 8:
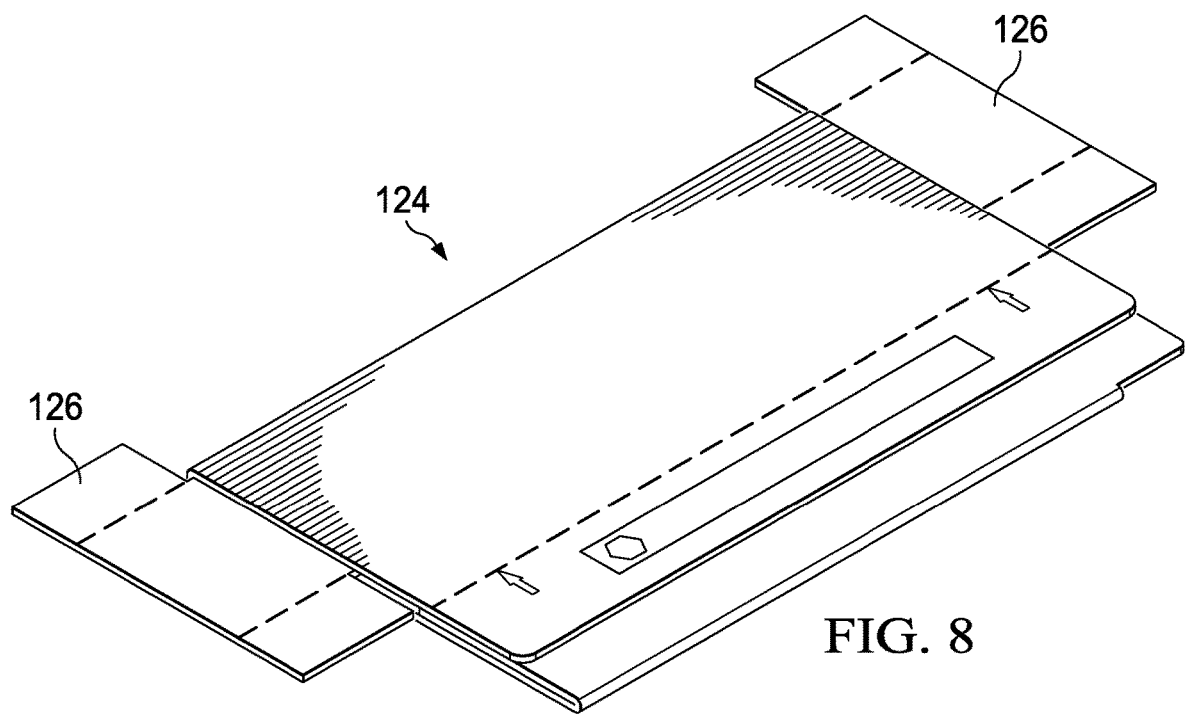

Turning now to FIG. 7 and FIG. 8, a different baffle 124 is shown, according to some embodiments. As shown in FIG. 8, baffle 124 may be of a substantially flat shape when folded. Baffle 124 is generally similar in design and function to baffle 118, and so only its differences will be discussed in detail.

In particular, baffle 124 may include tabs 126 at its sides. As shown in FIG. 7, tabs 126 may be folded inward when baffle 124 is being prepared for insertion into an information handling system. Tabs 126 may be used, for example, to provide additional structural rigidity in some embodiments.

As used herein, when two or more elements are referred to as "coupled" to one another, such term indicates that such two or more elements are in electronic communication, thermal communication, or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system comprising:
a first compartment at a first elevated pressure that is higher than an ambient pressure;
a second compartment at a second elevated pressure that is higher than the ambient pressure; and
a region adjacent to the first and second compartments and in fluid communication therewith, wherein the region is operable to receive a removable baffle therein;
wherein the baffle, when inserted into the region, is shaped as a rectangular prism with a first open end disposed at the first compartment and a second open end at the second compartment, such that the first compartment is in fluid communication with the second compartment via an interior of the baffle, and such that the baffle is operable to maintain the region at a third elevated pressure that is higher than the ambient pressure;
wherein the baffle, when not inserted into the region, is foldable into a substantially flat shape; and
wherein the baffle includes first and second tabs disposed respectively at the first and second open ends thereof, wherein the first and second tabs are foldable, such that when the baffle is shaped as a rectangular prism, the first and second tabs are folded inward into the rectangular prism and provide structural rigidity to the baffle to maintain the baffle in the rectangular prism shape, and such that when the baffle is folded into the substantially flat shape, the first and second tabs are substantially coplanar with the substantially flat shape.

2. The information handling system of claim 1, wherein:
when the baffle is not inserted into the region, an escape of gas through the region is configured to decrease the first elevated pressure of the first compartment and the second elevated pressure of the second compartment.

3. The information handling system of claim 1, wherein:
when the baffle is not inserted into the region, the region is operable to receive an information handling resource.

4. The information handling system of claim 3, wherein the baffle is usable to maintain the first and second elevated pressures during maintenance of the information handling resource.

5. The information handling system of claim 1, wherein the first and second elevated pressures are based on air movers disposed in the first and second compartments.

6. The information handling system of claim 1, wherein the first and second compartments further contain respective information handling resources.

7. The information handling system of claim 1, wherein the first elevated pressure and the second elevated pressure are equal.

8. A baffle comprising:
a plurality of airflow-directing surfaces;
wherein the baffle, when inserted into a region of an information handling system that is adjacent to first and second compartments of the information handling system and in fluid communication therewith, is shaped as a rectangular prism with a first open end disposed at the first compartment and a second open end disposed at the second compartment, such that the first compartment is in fluid communication with the second compartment via an interior of the baffle, and the baffle is operable to maintain the first and second compartments at at least one elevated pressure that is higher than an ambient pressure;
wherein the baffle, when not inserted into the region of the information handling system, is foldable into a substantially flat shape; and
wherein the baffle includes first and second tabs disposed respectively at the first and second open ends thereof, wherein the first and second tabs are foldable, such that when the baffle is shaped as a rectangular prism, the first and second tabs are folded inward into the rectangular prism and provide structural rigidity to the baffle to maintain the baffle in the rectangular prism shape, and such that when the baffle is folded into the substantially flat shape, the first and second tabs are substantially coplanar with the substantially flat shape.

9. The baffle of claim 8, further comprising one or more locating features configured to engage with one or more components of the information handling system to mechanically maintain a location of the baffle within the region.

10. The baffle of claim 8, further comprising a handle to facilitate insertion or removal of the baffle into the region.

11. The baffle of claim 8, wherein the baffle is formed from a single piece of material.

12. The baffle of claim 11, further comprising a seam along which two portions of the single piece of material are joined together.

13. The baffle of claim 8, wherein the baffle is made of a plastic material.

14. The baffle of claim 8, wherein when the baffle is not inserted into the region, the region is operable to receive an information handling resource.

15. The baffle of claim 14, wherein the information handling resource is another information handling system.

16. A method for forming a baffle for directing an airflow in an information handling system, the method comprising:
   forming a baffle having a plurality of airflow-directing surfaces from a baffle material; and
   shaping and sizing the baffle such that:
      when inserted into a region of an information handling system that is adjacent to first and second compartments of the information handling system and in fluid communication therewith, the baffle is shaped as a rectangular prism with a first open end disposed at the first compartment and a second open end disposed at the second compartment, such that the first compartment is in fluid communication with the second compartment via an interior of the baffle, and the baffle is operable to maintain the first and second compartments at at least one elevated pressure that is higher than an ambient pressure;
      when not inserted into the region of the information handling system, the baffle is foldable into a substantially flat shape; and
   wherein the baffle includes first and second tabs disposed respectively at the first and second open ends thereof, wherein the first and second tabs are foldable, such that when the baffle is shaped as a rectangular prism, the first and second tabs are folded inward into the rectangular prism and provide structural rigidity to the baffle to maintain the baffle in the rectangular prism shape, and such that when the baffle is folded into the substantially flat shape, the first and second tabs are substantially coplanar with the substantially flat shape.

17. The method of claim 16, wherein the baffle is formed from a single piece of material.

18. The method of claim 17, further comprising joining a first portion of the single piece of material to a second portion of the single piece of material to form a seam of the baffle.

19. The method of claim 16, further comprising forming a locating feature of the baffle, the locating feature being configured to engage with one or more components of the information handling system to mechanically maintain a location of the baffle within the region.

20. The method of claim 16, wherein the baffle material is a plastic material.

\* \* \* \* \*